(12) United States Patent
Kon

(10) Patent No.: US 10,976,510 B2
(45) Date of Patent: *Apr. 13, 2021

(54) OPTICAL RECEPTACLE AND OPTICAL MODULE

(71) Applicant: Enplas Corporation, Saitama (JP)

(72) Inventor: Ayano Kon, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/630,862

(22) PCT Filed: Jul. 13, 2018

(86) PCT No.: PCT/JP2018/026422
§ 371 (c)(1),
(2) Date: Jan. 14, 2020

(87) PCT Pub. No.: WO2019/013313
PCT Pub. Date: Jan. 17, 2019

(65) Prior Publication Data
US 2020/0150358 A1 May 14, 2020

(30) Foreign Application Priority Data
Jul. 14, 2017 (JP) .............................. JP2017-138328

(51) Int. Cl.
*G02B 6/42* (2006.01)
*H01S 5/022* (2021.01)
*H01S 5/183* (2006.01)

(52) U.S. Cl.
CPC .............. *G02B 6/425* (2013.01); *H01S 5/022* (2013.01); *H01S 5/183* (2013.01)

(58) Field of Classification Search
None
See application file for complete search history.

(56) References Cited

U.S. PATENT DOCUMENTS 6,028,708 A * 2/2000 Gramann ............. G02B 6/4246
359/196.1
6,219,470 B1 * 4/2001 Tu ......................... G02B 6/4204
385/14

(Continued)

FOREIGN PATENT DOCUMENTS

JP 2012-163903 8/2012
JP 2013-024918 2/2013

(Continued)

OTHER PUBLICATIONS

International Search Report and the Written Opinion dated Oct. 9, 2018 From the International Searching Authority Re. Application No. PCT/JP2018/026422 and Its Translation of Search Report Into English. (9 Pages).

*Primary Examiner* — Chad H Smith

(57) ABSTRACT

An optical receptacle comprises: a first optical surface; a first transmission part; a light separation unit; and a third optical surface. The light separation unit includes a reflective part and a second transmission part. Given that the optical axis of light which is incident on the first optical surface and exits the second optical surface is defined as a center axis and that an area that has an outer peripheral surface the same distance away from the center axis as the radius of the first optical surface or the second optical surface, whichever is greater, is defined as an optical effective area, the first transmission part and the second transmission part are located within the optical effective area.

7 Claims, 15 Drawing Sheets

(56) References Cited

U.S. PATENT DOCUMENTS

| | | | | |
|---|---|---|---|---|
| 6,571,033 B2* | 5/2003 | Caracci | G02B 6/29362 | 385/24 |
| 6,731,882 B1* | 5/2004 | Althaus | G02B 6/4246 | 257/E31.095 |
| 6,873,767 B2* | 3/2005 | Kuhara | G02B 6/12007 | 385/45 |
| 7,486,846 B2* | 2/2009 | Warashina | G02B 6/4246 | 385/14 |
| 7,991,251 B2* | 8/2011 | Hata | G02B 6/4204 | 385/24 |
| 8,787,714 B2* | 7/2014 | Morioka | G02B 6/4286 | 385/33 |
| 9,229,181 B2* | 1/2016 | Kanke | G02B 6/4214 | |
| 9,273,996 B2* | 3/2016 | Tanazawa | G01J 1/4257 | |
| 9,354,409 B2* | 5/2016 | Tanazawa | G02B 6/4246 | |
| 9,692,522 B2* | 6/2017 | Pfnuer | G02B 6/4214 | |
| 9,726,835 B2* | 8/2017 | Shibuya | G02B 6/4208 | |
| 9,971,106 B2* | 5/2018 | Morioka | G02B 6/4214 | |
| 10,184,785 B2* | 1/2019 | Morioka | H01L 31/125 | |
| 10,261,272 B2* | 4/2019 | Morioka | G02B 6/4286 | |
| 2003/0081645 A1* | 5/2003 | Uebbing | G02B 6/4214 | 372/101 |
| 2003/0152336 A1* | 8/2003 | Gurevich | G02B 6/4246 | 385/88 |
| 2003/0231841 A1* | 12/2003 | Nakanishi | G02B 6/4265 | 385/92 |
| 2004/0062479 A1* | 4/2004 | Capewell | G02B 6/4214 | 385/36 |
| 2004/0179784 A1* | 9/2004 | Vancoille | G02B 6/4227 | 385/47 |
| 2004/0264881 A1* | 12/2004 | Posamentier | G02B 6/4214 | 385/88 |
| 2008/0226228 A1* | 9/2008 | Tamura | G02B 6/4214 | 385/33 |
| 2010/0135619 A1* | 6/2010 | Choi | G02B 6/1228 | 385/88 |
| 2012/0261559 A1* | 10/2012 | Yan | G02B 27/14 | 250/227.28 |
| 2012/0263416 A1* | 10/2012 | Morioka | G02B 6/4286 | 385/33 |
| 2013/0242401 A1* | 9/2013 | Shibuya | G02B 6/4204 | 359/627 |
| 2013/0266260 A1* | 10/2013 | Morioka | G02B 6/4249 | 385/33 |
| 2014/0110570 A1* | 4/2014 | Morioka | G02B 6/425 | 250/216 |
| 2014/0133802 A1* | 5/2014 | Morioka | G02B 6/4286 | 385/33 |
| 2014/0270662 A1* | 9/2014 | Morioka | G02B 6/4204 | 385/93 |
| 2014/0328558 A1* | 11/2014 | Morioka | G02B 6/4214 | 385/33 |
| 2016/0341918 A1* | 11/2016 | Chang | G02B 6/4212 | |
| 2019/0094475 A1* | 3/2019 | Morioka | G02B 6/4246 | |
| 2019/0094476 A1* | 3/2019 | Kon | G02B 6/4206 | |
| 2020/0271874 A1* | 8/2020 | Kon | G02B 6/4214 | |

FOREIGN PATENT DOCUMENTS

| | | |
|---|---|---|
| JP | 2013-061587 | 4/2013 |
| WO | WO 2016/104302 | 6/2016 |
| WO | WO 2019/013313 | 1/2019 |

* cited by examiner

OPTICAL RECEPTACLE AND OPTICAL MODULE

TECHNICAL FIELD

The present invention relates to an optical receptacle and an optical module.

BACKGROUND ART

Conventionally, in optical communications using an optical transmission member such as an optical fiber and an optical waveguide, an optical module including a light emitting element such as a surface-emitting laser (e.g. a vertical-cavity surface-emitting laser (VCSEL)) has been used. Such an optical module includes an optical receptacle that operates such that light containing communication information emitted from a light emitting element is entered into an end surface of the optical transmission member.

In addition, for the purpose of adjusting the light output or stabilizing the output characteristics of a light emitting element against temperature variation, some optical modules include a detection element for checking (monitoring) the intensity and the quantity of the light emitted from the light emitting element.

For example, PTL 1 discloses an optical module including a photoelectric conversion device including a light emitting element and a detection element, and an optical receptacle that optically connects the light emitting element and an end surface of an optical transmission member. The optical receptacle includes a first surface that allows incidence of light emitted from a light-emitting element, a first reflection surface for reflecting, toward the end surface of the optical transmission member, light entered from the first surface, a transmission part that allows, to pass therethrough as a signal light travelling toward the end surface of the optical transmission member, a part of light reflected by the first reflection surface, a second reflection surface that reflects, as monitor light travelling toward the detection element, the remaining part of the light reflected by the first reflection surface, a second surface that emits the signal light past the transmission part such that the signal light is condensed at the end surface of the optical transmission member, and a third lens surface that emits, toward the detection element, the monitor light reflected by the second reflection surface.

In the optical module disclosed in PTL 1, the light emitted from light-emitting element is entered from the first surface. Light entered from the first surface is reflected by the first reflection surface such that a part of the light passes through the transmission part as signal light, and that the remaining part is reflected by the second reflection surface as monitor light. The signal light having passed through the transmission part is emitted from the second surface toward the end surface of the optical transmission member. On the other hand, the monitor light reflected by the second reflection surface is emitted from the third lens surface toward the light-receiving surface of the detection element.

CITATION LIST

Patent Literature

PTL 1
Japanese Patent Application Laid-Open No. 2013-24918

SUMMARY OF INVENTION

Technical Problem

In the optical module disclosed in PTL 1, however, when the position of the second reflection surface (hereinafter referred to as "reflection part") in the height direction is displaced from the intended position (i.e., the positional accuracy of the reflection part is poor) in the optical receptacle, the light splitting ratio between the light passing through the transmission part as signal light and the light reflected by reflection part as monitor light may be relatively largely varied. To reduce such a variation in light splitting ratio, it is desirable to increase the positional accuracy of the reflection part in the optical receptacle as much as possible. However, such an optical receptacle tends to increase the cost of the metal mold used for production.

In light of the above-mentioned circumstances, an object of the present invention is to provide an optical receptacle that can reduce variation in the light splitting ratio between signal light and monitor light due to a positional displacement of the reflection part in the optical receptacle, and can ease the required positional accuracy of the reflection part. In addition, another object of the present invention is to provide an optical module including the optical receptacle.

Solution to Problem

An optical receptacle according to an embodiment of the present invention is configured to optically couple a light-emitting element and an end surface of an optical transmission member when the optical receptacle is disposed between a photoelectric conversion device and the optical transmission member, the photoelectric conversion device including the light-emitting element and a detection element configured to monitor light emitted from the light-emitting element, the optical receptacle including: a first optical surface configured to allow incidence of the light emitted from the light-emitting element; a first transmission part configured to allow, to pass through the first transmission part as signal light travelling toward the end surface of the optical transmission member, a part of light entered from the first optical surface; a light separation part configured to separate another part of the light entered from the first optical surface into monitor light travelling toward the detection element and signal light travelling toward the end surface of the optical transmission member; a second optical surface configured to emit, toward the end surface of the optical transmission member, the signal light past the first transmission part and the signal light separated by the light separation part; and a third optical surface configured to emit, toward the detection element, the monitor light separated by the light separation part. The light separation part includes a reflection part that is an inclined surface inclined to an optical axis of the light entered from the first optical surface, the reflection part being configured to reflect, toward the third optical surface as the monitor light, a part of light impinging on the light separation part, and a second transmission part disposed next to the reflection part, and configured to allow, to pass through the second transmission part as the signal light, another part of the light impinging on the light separation part. The first transmission part and the second transmission part are located within an optical effective region, the optical effective region being a region around an optical axis of light entered from the first optical surface and emitted from the second optical surface, the optical axis being a central axis of the optical effective region, the optical effective region being a region whose outer edge is a surface whose distance to the central axis is equal to a radius of one of the first optical surface and second optical surface, the radius being larger than a radius of the other of the first optical surface and second optical surface.

An optical module according to an embodiment of the present invention includes a photoelectric conversion device including a substrate, a light-emitting element disposed on the substrate, and a detection element disposed on the substrate and configured to monitor light emitted from the light-emitting element; and the optical receptacle. The first transmission part and the second transmission part are located within a light flux of light that is emitted from the light-emitting element and is entered from the first optical surface.

Advantageous Effects of Invention

With the embodiment of the present invention, it is possible to provide an optical receptacle provide that can reduce variation in the light splitting ratio between signal light and monitor light due to a positional displacement of the reflection part in the optical receptacle, and can ease the required positional accuracy of the reflection part.

DESCRIPTION OF EMBODIMENTS

Embodiments of the present invention are elaborated below with reference to the accompanying drawings.

Embodiment 1

Configuration of Optical Module

Figure 1:
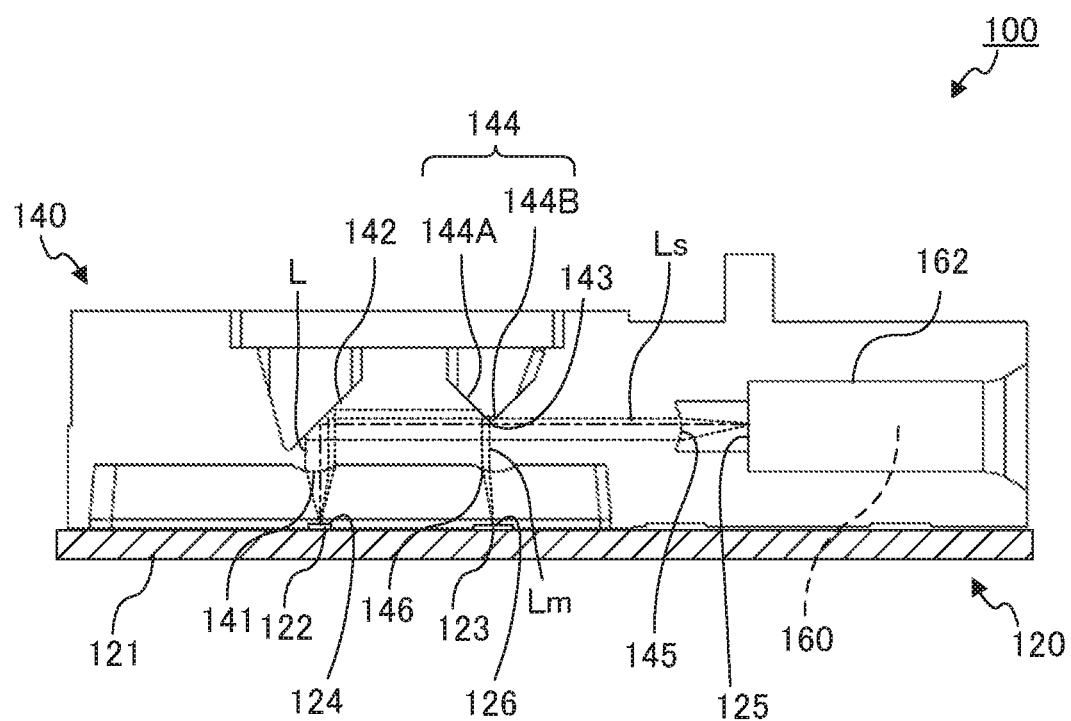
FIG. 1 is a sectional view of an optical module according to Embodiment 1.

FIG. 1 is a sectional view of optical module 100 according to Embodiment 1. FIG. 1 illustrates light paths in optical module 100. Note that, in FIG. 1, the hatching on the cross-section of optical receptacle 140 is omitted to illustrate light paths inside optical receptacle 140.

As illustrated in FIG. 1, optical module 100 includes photoelectric conversion device 120 of a substrate mounting type including light-emitting element 122, and optical receptacle 140. Optical module 100 is a transmitting optical module, and is used in the state where optical transmission member 160 is coupled (hereinafter referred to also as "connected") with optical receptacle 140 through ferrule 162. The type of optical transmission member 160 is not limited, and optical transmission member 160 may be an optical fiber, a light waveguide or the like. In the present embodiment, optical transmission member 160 is an optical fiber. The optical fiber may be of a single mode type, or a multiple mode type. The number of optical transmission member 160 is not limited. In the present embodiment, one optical transmission member 160 is provided.

Photoelectric conversion device 120 includes substrate 121, one light-emitting element 122, and one detection element 123.

Substrate 121 is a glass composite substrate, a glass epoxy substrate, or a flexible substrate, for example. Light-emitting element 122 and detection element 123 are disposed on substrate 121.

Light emitting element 122 is disposed on substrate 121, and emits laser light in a direction perpendicular to the installation part of substrate 121 where light emitting element 122 is disposed. The number of light emitting element 122 is not limited. In the present embodiment, one light-emitting element 122 is provided. In addition, the position of light-emitting element 122 is not limited. Light emitting element 122 is a vertical-cavity surface-emitting laser (VCSEL), for example.

Detection element 123 receives monitor light Lm for monitoring the output (e.g., the intensity and the quantity) of emission light L emitted from light emitting element 122. Detection element 123 is a photodetector, for example. The number of detection element 123 is not limited. In the present embodiment, one detection element 123 is provided. In addition, from the viewpoint of preventing reentrance of reflection light from detection element 123 into optical receptacle 140, the optical axis of monitor light Lm that enters detection element 123 may be tilted to detection surface 126 of detection element 123.

Optical receptacle 140 is disposed on substrate 121 of photoelectric conversion device 120. In the state where optical receptacle 140 is disposed between photoelectric conversion device 120 and optical transmission member 160, optical receptacle 140 optically couples (hereinafter referred to also as "connects") light-emitting surface 124 of light-emitting element 122 and end surface 125 of optical transmission member 160. A configuration of optical receptacle 140 is elaborated below.

Configuration of Optical Receptacle

Figure 2A:
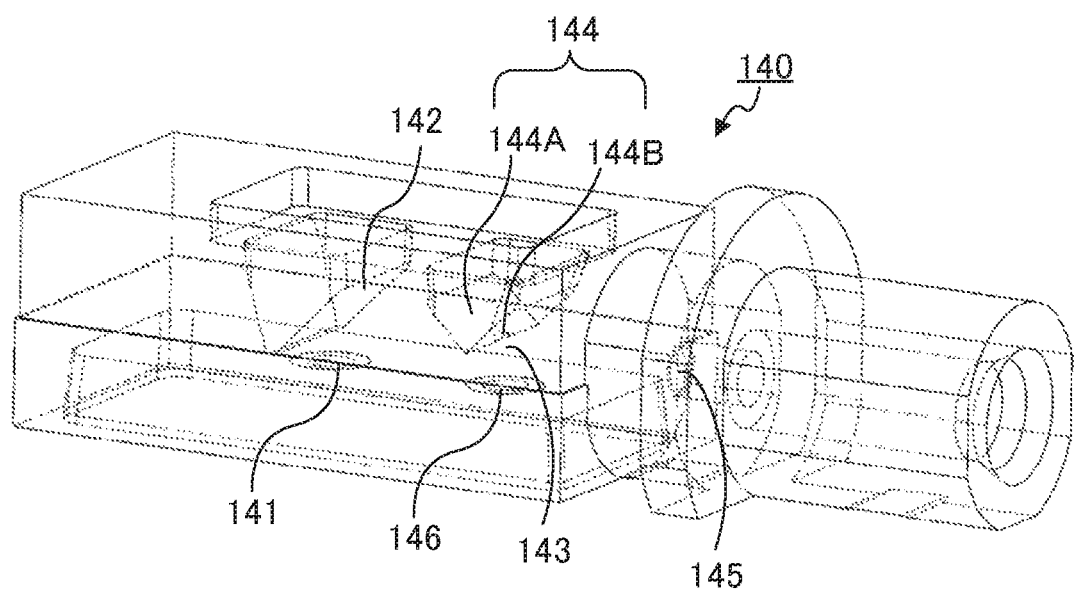
FIGS. 2A and 2B are perspective views illustrating a configuration of the optical receptacle according to Embodiment 1.
Figure 2B:
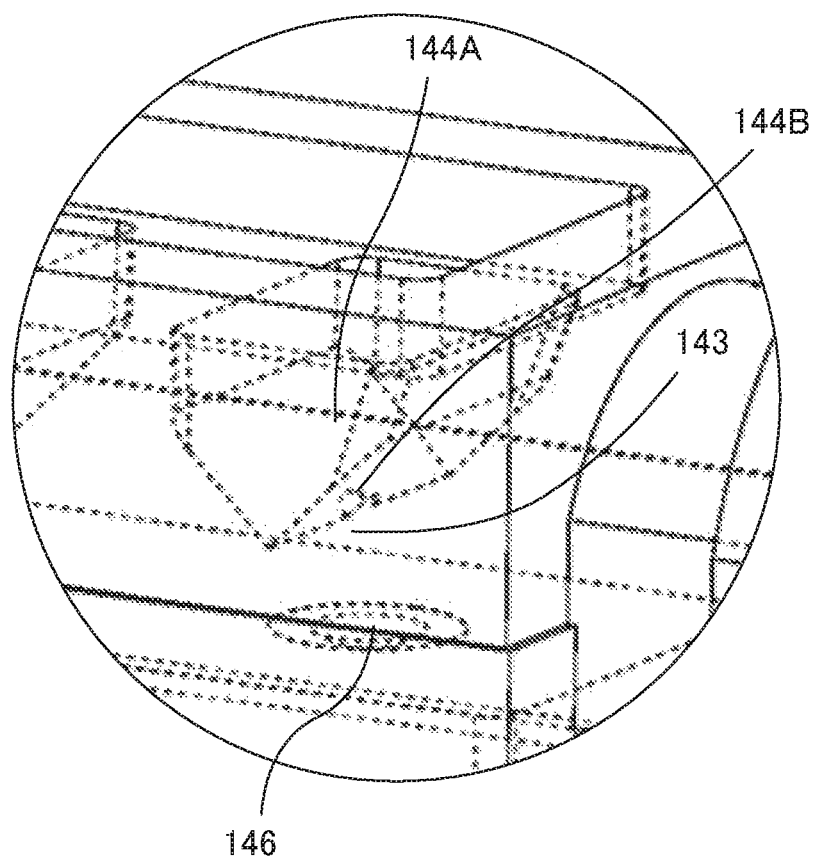
Figure 3A:
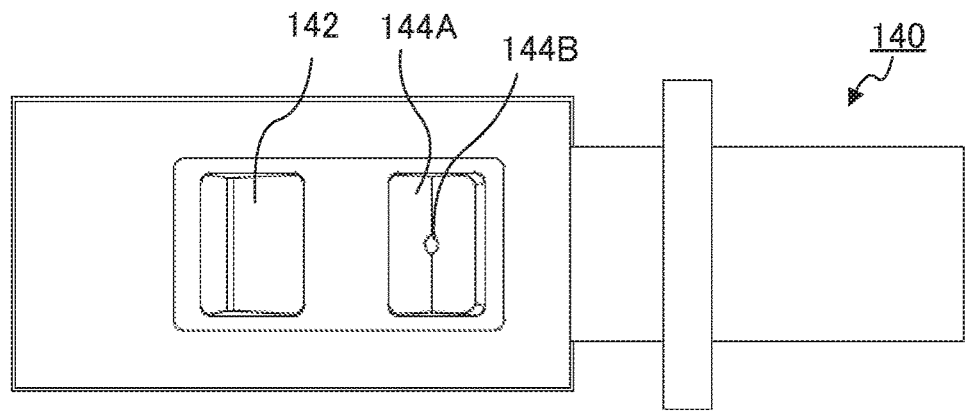
FIGS. 3A to 3C illustrate a configuration of the optical receptacle according to Embodiment 1.
Figure 3B:
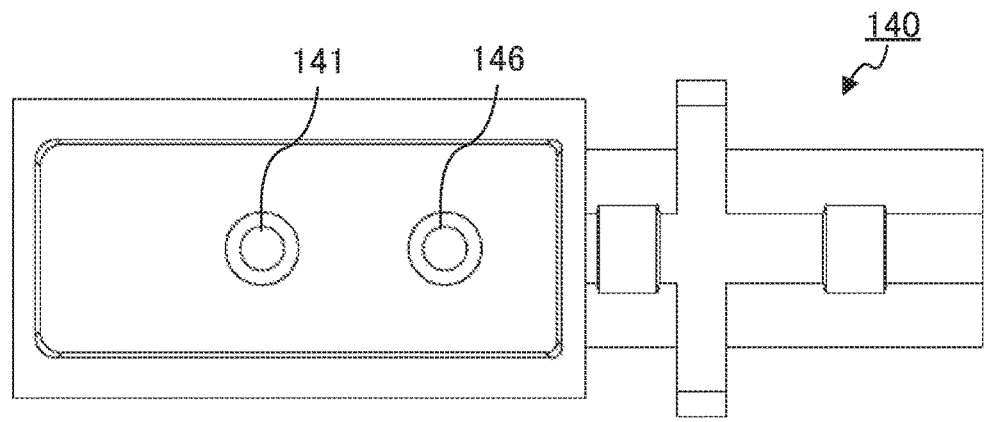
Figure 3C:
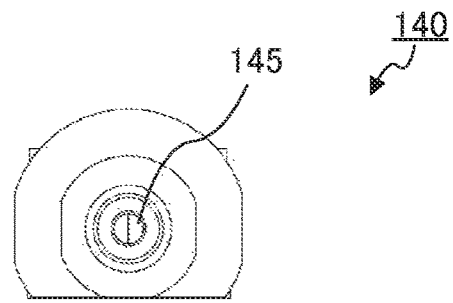
Figure 4:
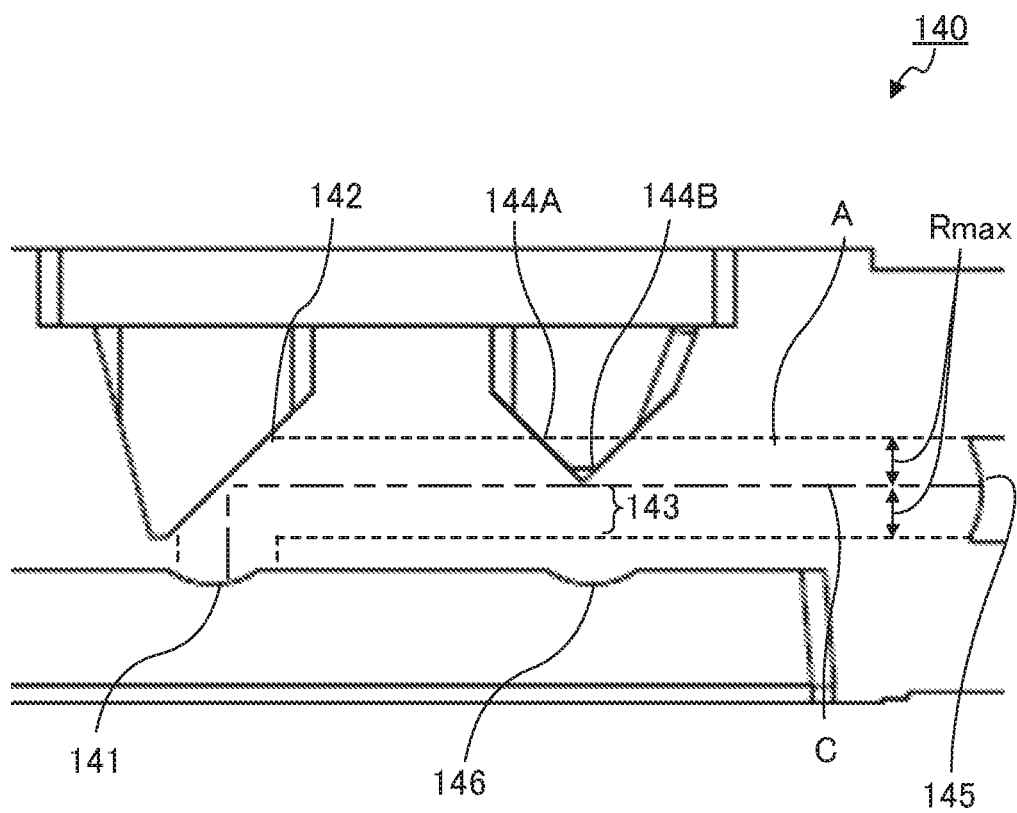
FIG. 4 is a partially enlarged sectional view illustrating a configuration of the optical receptacle according to Embodiment 1.

FIGS. 2A to 4 illustrate a configuration of optical receptacle 140 according to the present embodiment. FIG. 2A is a perspective view of optical receptacle 140, and FIG. 2B is a partially enlarged perspective view of FIG. 2A. FIG. 3A is a plan view of optical receptacle 140, FIG. 3B is a bottom view of optical receptacle 140, and FIG. 3C is a front view of optical receptacle 140. FIG. 4 is a partially enlarged sectional view illustrating a configuration of the optical receptacle according to the present embodiment.

As illustrated in FIGS. 2A to 3C, optical receptacle 140 is optically transparent. Optical receptacle 140 emits, toward end surface 125 of optical transmission member 160 as signal light Ls, a part of emission light L emitted from light-emitting surface 124 of light-emitting element 122, and emits, toward detection element 123 as monitor light Lm, the other part of emission light L emitted from light-emitting surface 124 of light-emitting element 122. Optical receptacle 140 includes first optical surface 141, reflection surface 142, first transmission part 143, light separation part 144, second optical surface 145, and third optical surface 146. Light separation part 144 includes reflection part 144A and second transmission part 144B. In the present embodiment, one first optical surface 141, one first transmission part 143, one second transmission part 144B, one second optical surface 145 and one third optical surface 146 are provided.

Optical receptacle 140 is formed using a material having a transparency to light of the wavelength used in optical communications. Examples of such a material include transparent resins such as polyetherimide (PEI) and cyclic olefin resin. In addition, for example, optical receptacle 140 is manufactured by injection molding.

First optical surface 141 is an optical surface that allows emission light L emitted from light-emitting element 122 to enter optical receptacle 140 while refracting emission light L. First optical surface 141 can convert emission light L emitted from light-emitting element 122 into collimated light, converged light, or diffused light. In the present embodiment, first optical surface 141 converts emission light L emitted from light-emitting element 122 into collimated light. In the present embodiment, first optical surface 141 has a shape of a convex lens protruding toward light emitting element 122. In addition, first optical surface 141 has a circular shape in plan view. The central axis of first optical surface 141 is preferably perpendicular to light-emitting surface 124 of light-emitting element 122. In addition, preferably, the central axis of first optical surface 141 matches the optical axis of emission light L emitted from light-emitting element 122.

Reflection surface 142 is an inclined surface formed in the top side of optical receptacle 140, and is disposed on the light path between first optical surface 141 and first transmission part 143 and the light path between first optical surface 141 and light separation part 144. Reflection surface 142 reflects, toward first transmission part 143 and light separation part 144, the light entered from first optical surface 141 (emission light L emitted from light-emitting element 122). Reflection surface 142 is tilted such that the distance to optical transmission member 160 decreases in the direction from the bottom surface toward the top surface of optical receptacle 140. In the present embodiment, the inclination angle of reflection surface 142 is 45 degrees with respect to the optical axis of emission light L entered from first optical surface 141. Emission light L entered from first optical surface 141 internally impinges on reflection surface 142 at an incident angle greater than the critical angle. In this manner, reflection surface 142 totally reflects incident emission light L in the direction along the surface of substrate 121.

First transmission part 143 is a region that allows, to pass therethrough as signal light Ls travelling toward end surface 125 of optical transmission member 160, a part of the light entered from first optical surface 141. First transmission part 143 is disposed in contact with second transmission part 144B of light separation part 144.

Light separation part 144 separates the other part (preferably the remaining part) of the light entered from first optical surface 141 into monitor light Lm travelling toward third optical surface 146 (or detection element 123) and signal light Ls travelling toward second optical surface 145 (or end surface 125 of optical transmission member 160). Light separation part 144 includes reflection part 144A and second transmission part 144B.

Reflection part 144A is disposed in the top side of optical receptacle 140. Reflection part 144A is inclined to the optical axis of the light entered from first optical surface 141, and reflects, toward third optical surface 146, a part of the other part of the light that impinges on light separation part 144. In the present embodiment, reflection part 144A is an inclined surface that is inclined such that reflection part 144A comes closer to second optical surface 145 (optical transmission member 160) in the direction from the top surface toward the bottom surface of optical receptacle 140. The inclination angle of the inclined surface is 45° with respect to the optical axis of the light entered from first optical surface 141.

Second transmission part 144B is disposed next to reflection part 144A, and allows, to pass therethrough as signal light Ls, a part of the other part of the light that impinges on light separation part 144 (except for the light reflected by reflection part 144A). Preferably, second transmission part 144B is in contact with first transmission part 143.

In the present embodiment, boundary part 148 between first transmission part 143 and light separation part 144 (second transmission part 144B) is located near the optical axis of the light entered from first optical surface 141 (see FIG. 8 described later).

Both first transmission part 143 and second transmission part 144B are located within optical effective region A around central axis C that is the optical axis of the light that is entered from first optical surface 141 and emitted from second optical surface 145. The outer edge of optical effective region A is a surface whose distance to central axis C is equal to radius Rmax of one of first optical surface 141 or second optical surface 145 that has a size larger than that of the other of first optical surface 141 or second optical surface 145 (see FIG. 4). In the present embodiment, optical effective region A is a columnar region whose outer edge is a surface whose distance to central axis C is equal to the radius of second optical surface 145. With such a configuration, first transmission part 143 and second transmission part 144B can be located within the light flux of the light that is entered from first optical surface 141 and is emitted from second optical surface 145 (see FIGS. 1 and 8).

In general, regarding the light emitted from light-emitting element 122, the closer to the optical axis, the higher the intensity thereof. As such, even with a slight displacement of the position of light separation part 144 in the height direction in a region near the optical axis, the light splitting ratio between monitor light Lm and signal light Ls may be relatively largely varied. Accordingly, from the view point of reducing the variation in light splitting ratio in association with the positional accuracy of light separation part 144, it is preferable to dispose second transmission part 144B so as to include at least a region near the optical axis of light L entered from first optical surface 141 (so as to surround the region near the optical axis of light L at the center) in the cross-section perpendicular to the optical axis of light L entered from first optical surface 141 (the cross-section perpendicular to the optical axis of the light reflected by reflection surface 142).

The cross-sectional shape of second transmission part 144B in the cross-section perpendicular to the optical axis of light L entered from first optical surface 141 is not limited, and may include an arch shape and a polygonal shape (such as a triangular shape and a rectangular). The arch shape is a shape with an arc or an elliptical arc and a straight line connecting the ends of the arc or the elliptical arc, and examples of the arch shape include a semicircular shape. In the present embodiment, since the optical axis of light L entered from first optical surface 141 is located on boundary part 148 between first transmission part 143 and second transmission part 144B, it is preferable that the cross-sectional shape of second transmission part 144B be a semicircular shape whose center is the intersection of the boundary part 148 and the optical axis of light L entered from first optical surface 141 (see FIGS. 2B and 8).

As described above, the cross-sectional area of second transmission part 144B in the cross-section perpendicular to the optical axis of light L entered from first optical surface 141 is smaller than the cross-sectional area of optical effective region A. To be more specific, the cross-sectional area of second transmission part 144B is preferably 18 to 36% of the cross-sectional area of optical effective region A, or more preferably 18 to 29% of the cross-sectional area of optical effective region A. When the cross-sectional area of second transmission part 144B is 18% or greater, the variation in light splitting ratio due to the positional displacement of light separation part 144 (or reflection part 144A) in the height direction can be further reduced. When the cross-sectional area of second transmission part 144B is 36% or smaller, excessive reduction in light that is reflected at reflection part 144A as monitor light Lm can be prevented.

In the following description, the height direction is a direction that connects the bottom surface and the top surface of optical receptacle 140, and is perpendicular to the optical axis of the light passing through first transmission part 143 or second transmission part 144B.

In the present embodiment, second transmission part 144B is disposed such that signal light Ls past it is emitted first from second optical surface 145 to the outside of optical receptacle 140 (see FIG. 1). In other words, second transmission part 144B does not include a transmission surface that is disposed on the light path between second transmission part 144B and second optical surface 145, and is configured to emit, to the outside of optical receptacle 140, the light past second transmission part 144B.

In the present embodiment, as described above, a part of light L entered from first optical surface 141 passes through first transmission part 143, and becomes signal light Ls travelling toward end surface 125 of optical transmission member 160. Another part (preferably the remaining part) of the light entered from first optical surface 141 impinges on light separation part 144 such that a part of the impinging light is reflected by reflection part 144A and becomes monitor light Lm travelling toward the detection element, and that another part of the impinging light (preferably the light other than the light reflected by reflection part 144A) passes through second transmission part 144B and becomes signal light Ls travelling toward end surface 125 of optical transmission member 160.

The ratio between the quantity of signal light Ls and the quantity of monitor light Lm is not limited as long as monitor light Lm capable of monitoring the intensity and the quantity of light L emitted from light emitting element 122 can be obtained while ensuring a desired quantity of signal light Ls. In the present embodiment, signal light Ls is the sum of the signal light past first transmission part 143, and the signal light past second transmission part 144B. Preferably, the quantity ratio between signal light Ls and monitor light Lm is signal light Ls:monitor light Lm=6:4 to 8:2. More preferably, the quantity ratio between signal light Ls and monitor light Lm is signal light Ls:monitor light Lm=7:3.

Second optical surface 145 is an optical surface that emits, toward end surface 125 of optical transmission member 160, signal light Ls past first transmission part 143 and signal light Ls separated by light separation part 144. In the present embodiment, second optical surface 145 is disposed in the front surface of optical receptacle 140 so as to face end surface 125 of optical transmission member 160. Second optical surface 144 has a shape of a convex lens protruding toward end surface 125 of optical transmission member 160. With this configuration, signal light Ls past first transmission part 143 from first optical surface 141 and signal light Ls separated by light separation part 144 can be condensed and efficiently coupled to end surface 125 of optical transmission member 160.

Third optical surface 146 is disposed on the bottom surface side of optical receptacle 140 in such a manner as to face detection element 123. In the present embodiment, third optical surface 146 is a convex lens surface protruding toward detection element 123. Third optical surface 146 causes convergence of monitor light Lm separated by reflection part 144A of light separation part 144 and emits the light toward detection element 123. In this manner, it is possible to efficiently couple monitor light Lm to detection element 123. Preferably, the central axis of third optical surface 146 is perpendicular to the light reception surface (substrate 121) of detection element 123.

Operation

Figure 5:
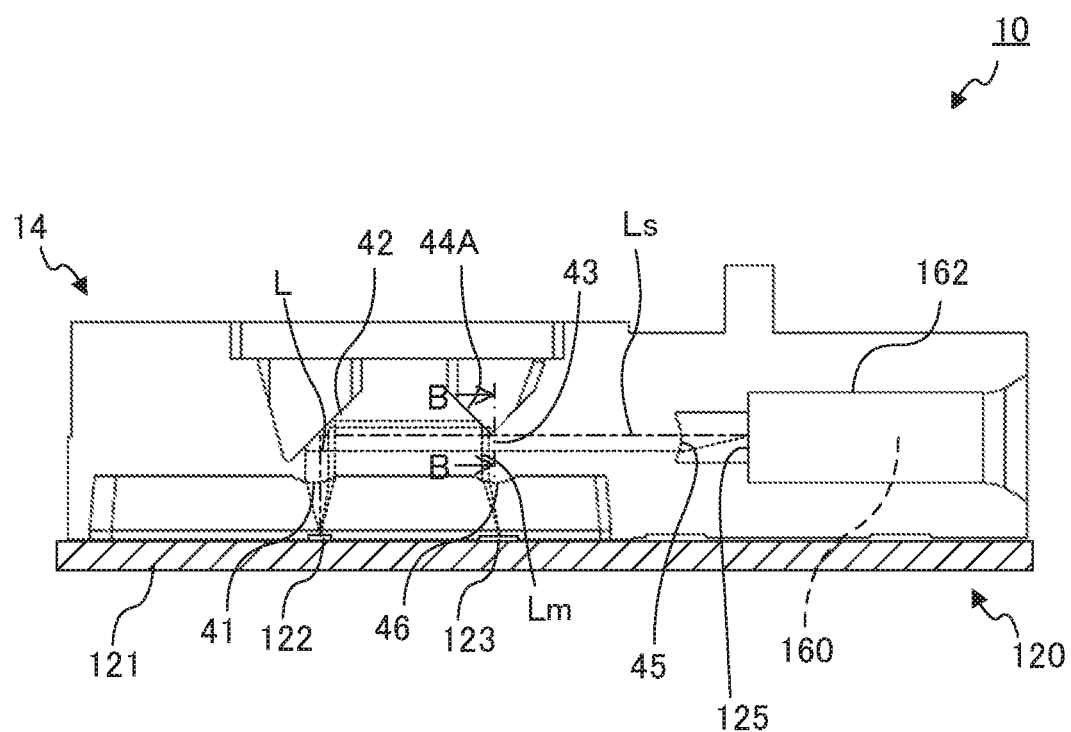
FIG. 5 is a sectional view of the comparative optical module.
Figure 6:
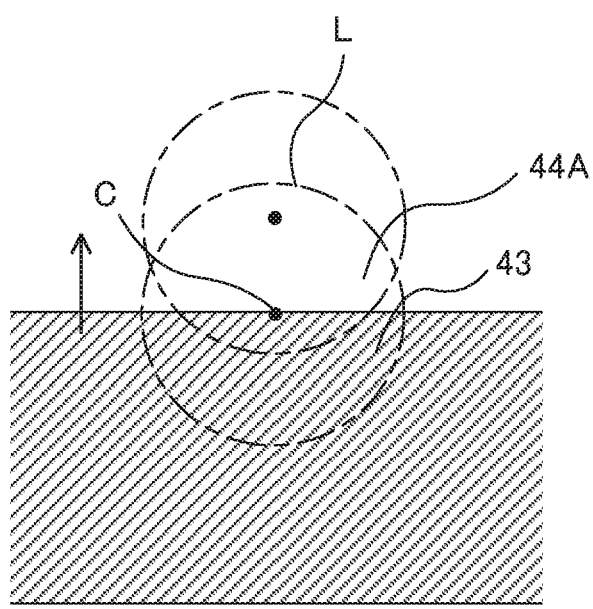
FIG. 6 is a sectional view illustrating a positional relationship between light incident on a first optical surface and a transmission part in a cross-section along line B-B of FIG. 5.
Figure 7:
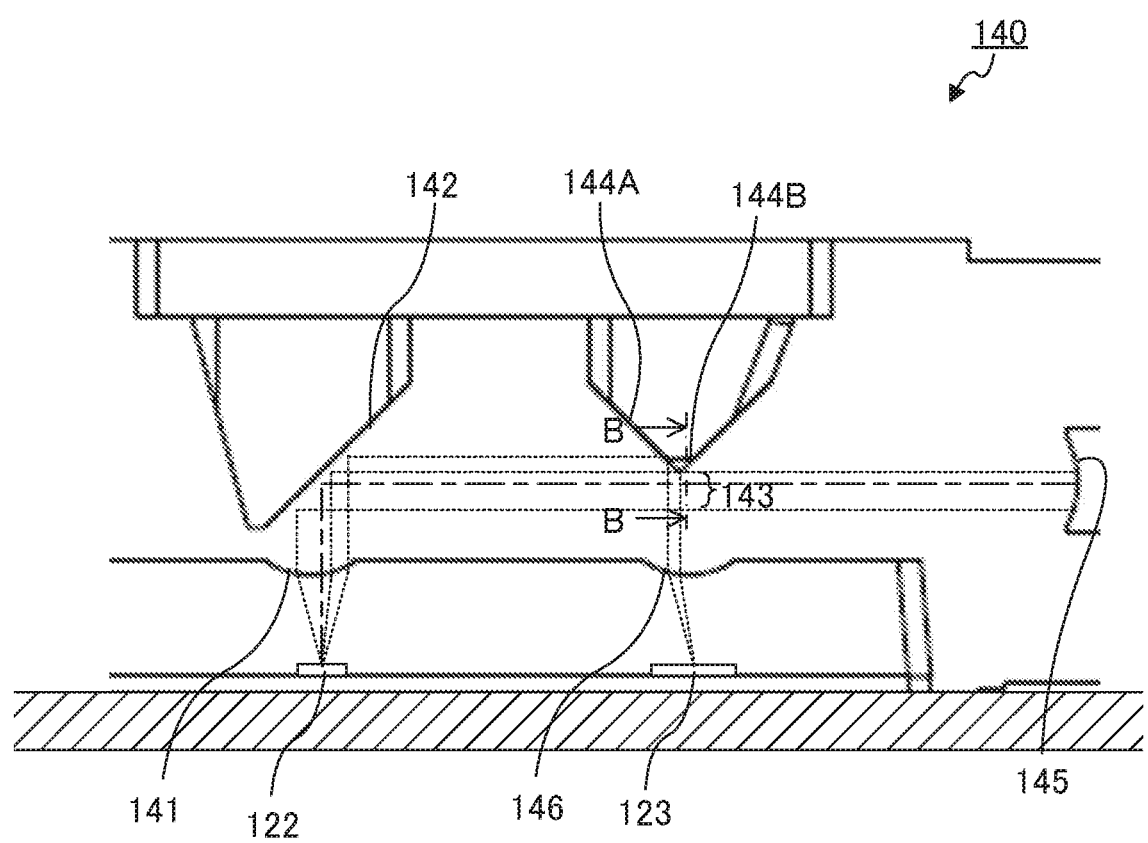
FIG. 7 is a partially enlarged sectional view of a region near the light separation part of FIG. 1.

An operation of optical module 100 according to the present embodiment is described in comparison with a comparative optical module. FIG. 5 is a sectional view illustrating a configuration of comparative optical module 10. Comparative optical module 10 has a configuration identical to that of optical module 100 according to the present embodiment except that the second transmission part is not provided in optical receptacle 14. FIG. 6 is a sectional view illustrating a positional relationship between light L entered from first optical surface 41 and first transmission part 43 in a cross-section along line B-B of FIG. 5. FIG. 7 is a partially enlarged sectional view of a region near light separation part 144 illustrated in FIG. 1. FIG. 8 is a sectional view illustrating a positional relationship between light L entered from first optical surface 141, first transmission part 143 and second transmission part 144B in a cross-section along line B-B of FIG. 7.

As illustrated in FIG. 5, in comparative optical module 10, emission light L emitted from light-emitting element 122 enters optical receptacle 14 from first optical surface 41. The light entered from first optical surface 41 is reflected by reflection surface 42 such that a part of the light passes through first transmission part 43 and becomes signal light Ls travelling toward optical transmission member 160 and that another part (preferably the remaining part) of the light is reflected by reflection part 44A and becomes monitor light Lm travelling toward detection element 123. Signal light Ls travelling past first transmission part 43 toward optical transmission member 160 is emitted from second optical surface 45 so as to reach end surface 125 of optical transmission member 160. On the other hand, monitor light Lm travelling toward detection element 123 is emitted from third optical surface 46 so as to reach detection element 123.

For example, with such a comparative optical module 10, when the position of the light entered from first optical surface 141 is displaced upward with respect to first transmission part 43 (see the arrow) due to a positional displacement of reflection part 44A in optical receptacle 14 as illustrated in FIG. 6, the highly intense light located near the center is reflected by reflection part 144A without passing through first transmission part 43, and consequently the intensity of signal light Ls tends to be significantly reduced. In other words, the variation in light splitting ratio between signal light Ls past first transmission part 43 and monitor light Lm reflected by reflection part 44A is relatively large.

In contrast, in optical module 100 according to the present embodiment, emission light L emitted from light-emitting element 122 enters optical receptacle 140 from first optical surface 141 as illustrated in FIGS. 1 and 7. The light entered from first optical surface 141 is reflected by reflection surface 142 such that a part of the light passes through first transmission part 143 and becomes signal light Ls travelling toward optical transmission member 160, and that another part (preferably the remaining part) of the light impinges on separation part 144. A part of the light impinging on light separation part 144 is reflected by reflection part 144A and becomes monitor light Lm travelling toward detection element 123, and another part of the impinging light (preferably the light other than the light reflected by reflection part 144A) passes through second transmission part 144B and becomes signal light Ls travelling toward optical transmission member 160. Signal light Ls past first transmission part 143 and signal light Ls past second transmission part 144B are emitted from second optical surface 145 so as to reach end surface 125 of optical transmission member 160. On the other hand, monitor light Lm travelling toward detection element 123 is emitted from third optical surface 146 so as to reach detection element 123.

Figure 8:
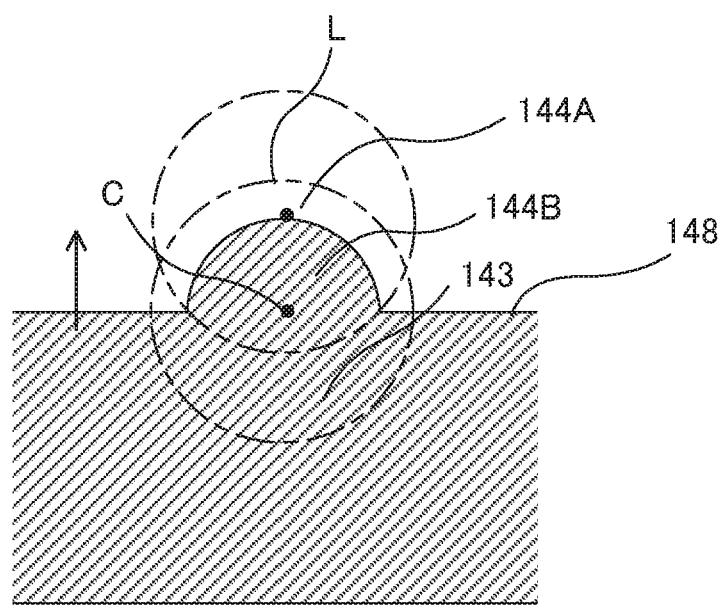
FIG. 8 is a sectional view illustrating a positional relationship between light incident on the first optical surface, a first transmission part and a second transmission part in a cross-section along line B-B of FIG. 7.

With such an optical module 100 according to the present embodiment, even when the position of the light entered from first optical surface 141 is displaced upward with respect to first transmission part 143 (see the arrow) due to a positional displacement of light separation part 144 in optical receptacle 140 as illustrated in FIG. 8 for example, the highly intense light located near the center passes through second transmission part 144B toward second optical surface 145, and thus reduction in the intensity of signal light Ls is small. In other words, the variation in light splitting ratio between signal light Ls and monitor light Lm can be reduced.

Simulation

The ratio of monitor light Lm to the amount of light L emitted from light-emitting element 122 was simulated while the position of light separation part 144 in the height direction in optical receptacle 140 was changed.

As illustrated in Table 1, the ratio (%) of monitor light Lm to emission light L emitted from light-emitting element 122 was simulated with analysis software while the position of light separation part 144 in the height direction was displaced at an interval of 0.002 mm in a range from the reference position (0 mm) to 0.02 mm in the upward direction in optical module 100 according to the present embodiment. Note that the reference position was set at the intersection of the optical axis of light L entered from first optical surface 141 and boundary part 148 between first transmission part 143 and second transmission part 144B (see FIG. 8).

In addition, for comparison, the simulation was performed with optical module 10 (see FIG. 5) including a comparative optical receptacle that has a configuration same as that of optical module 100 according to the present embodiment except that the second transmission part is not provided.

A vertical-cavity surface-emitting laser (VCSEL) having a numerical aperture (NA) of 0.25 and a light emission diameter of φ8 μm was used as light-emitting element 122 for the simulation. An optical fiber having a numerical aperture (NA) of 0.20 and a core diameter of φ50 μm was used as optical transmission member 160. Table 1 shows results of the simulation.

TABLE 1

|  |  | Quantity Ratio (%) of Monitor Light to Light Emitted From Light-emitting Element 122 | |
|---|---|---|---|
|  |  | Present Embodiment | Comparative Example |
| Position (mm) of Light Separation Part 144 or 44 In Height Direction | 0.000 | 14.1 | 14.1 |
|  | 0.002 | 12.7 | 12.5 |
|  | 0.004 | 11.4 | 11.1 |
|  | 0.006 | 10.1 | 9.7 |
|  | 0.008 | 9.0 | 8.4 |
|  | 0.010 | 8.0 | 7.3 |
|  | 0.012 | 7.1 | 6.2 |
|  | 0.014 | 6.3 | 5.2 |
|  | 0.016 | 5.6 | 4.3 |
|  | 0.018 | 5.0 | 3.6 |
|  | 0.020 | 4.6 | 2.9 |

As shown in Table 1, in optical module 100 according to the present embodiment, the intended monitor light ratio (e.g., 5 to 14%) can be achieved when the position of light separation part 144 in the height direction falls within a range of 0 to 0.018 mm.

In contrast, in comparative optical receptacle 10, it is necessary that the position of light separation part 44 in the height direction be fall within a range of 0 to 0.014 mm to achieve the intended monitor light ratio (e.g., 5 to 14%).

That is, the acceptable positional range of light separation part 144 in the height direction for achieving the intended monitor light ratio is broader in the optical module according to the present embodiment, or in other words, the level of the positional accuracy of light separation part 144 required for the optical receptacle can be eased.

Effect

As described above, optical module 100 according to the present embodiment further includes second transmission part 144B in addition to first transmission part 143. Thus, even with positional displacement of light separation part 144 in optical receptacle 140, variation in light splitting ratio between monitor light Lm and signal light Ls can be reduced. Thus, the level of the positional accuracy required for light separation part 144 in optical receptacle 140 can be eased.

Embodiment 2

Configuration of Optical Module

Optical module 200 according to Embodiment 2 is different from optical module 100 according to Embodiment 1 in configuration of optical receptacle 240. To be more specific, optical receptacle 240 according to the present embodiment is different from optical receptacle 140 according to Embodiment 1 in that the shape of second transmission part 244B is different and that fourth optical surface 147 is further provided. In view of this, only second transmission part 244B and fourth optical surface 147 are described, and the components similar to those of Embodiment 1 are denoted with the same reference numerals and the description thereof will be omitted.

Figure 9:
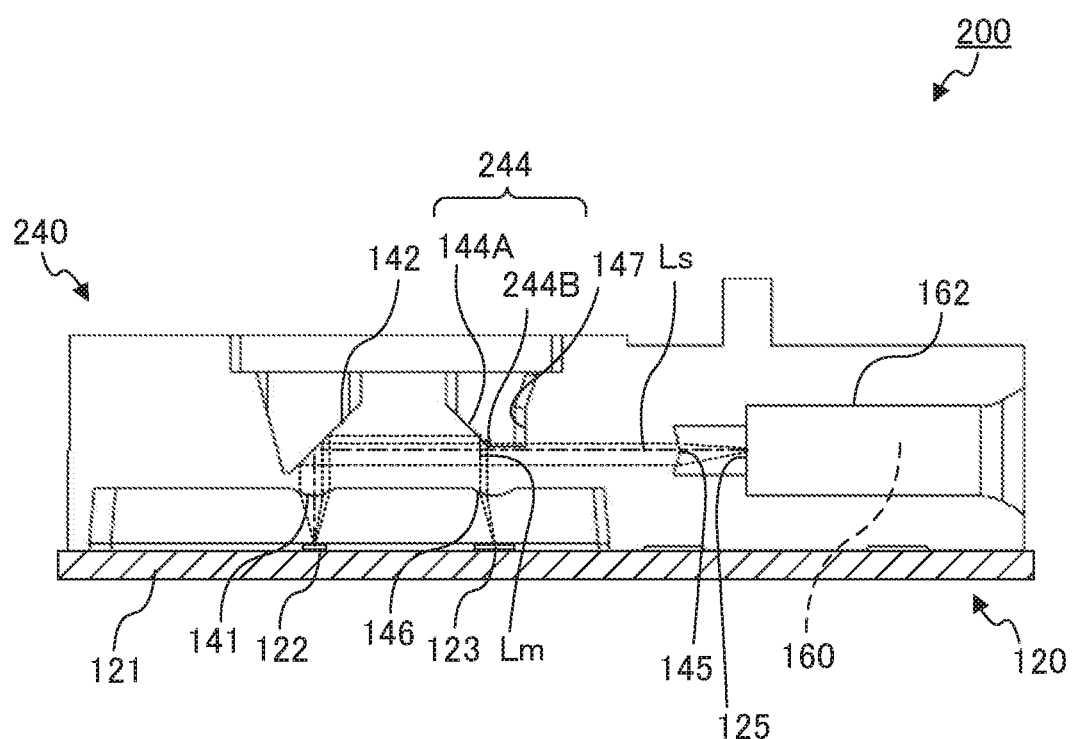
FIG. 9 is a sectional view of an optical module according to Embodiment 2.

FIG. 9 is a sectional view of optical module 200 according to Embodiment 2. FIG. 9 illustrates light paths of optical module 200. Note that, in FIG. 9, the hatching on the cross-section of optical receptacle 240 is omitted to illustrate light paths in optical receptacle 240.

As illustrated in FIG. 9, optical module 200 includes photoelectric conversion device 120 of a substrate mounting type including light-emitting element 122, and optical receptacle 240.

Configuration of Optical Receptacle

Figure 10A:
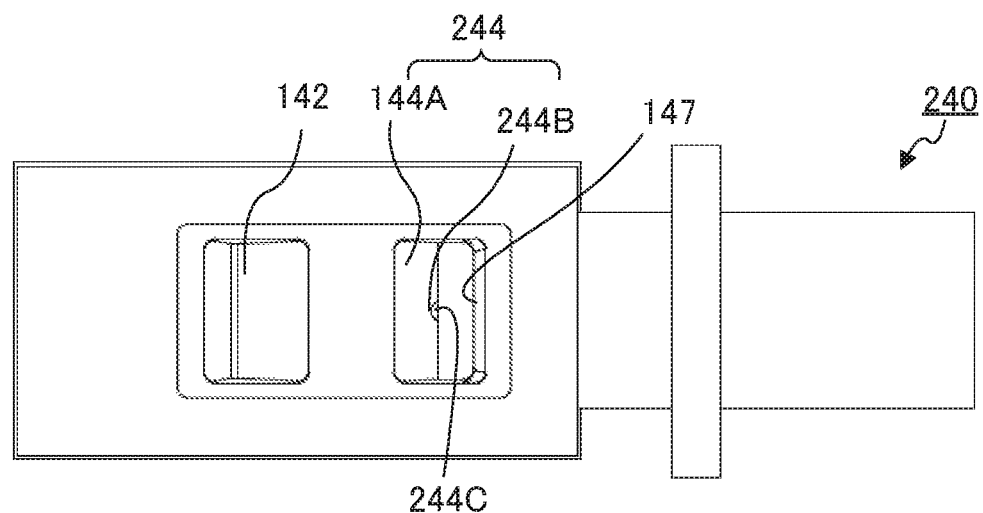
FIGS. 10A to 10C illustrate a configuration of an optical receptacle according to Embodiment 2.
Figure 10B:
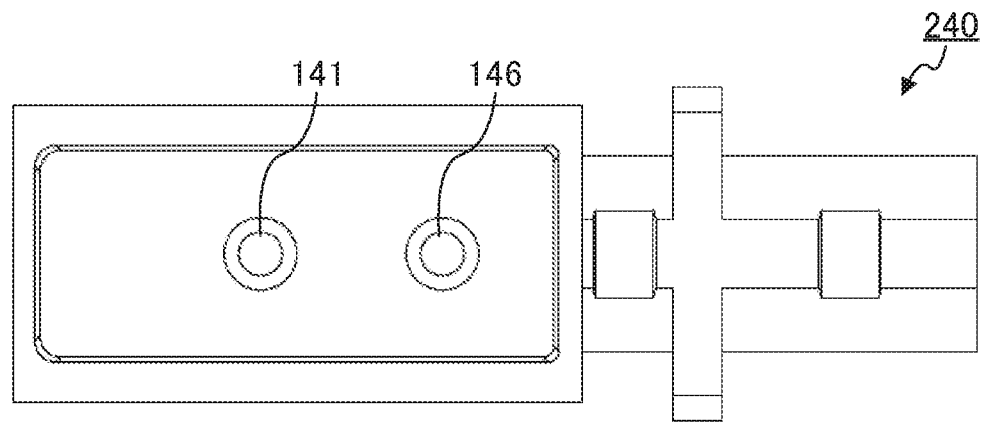
Figure 10C:
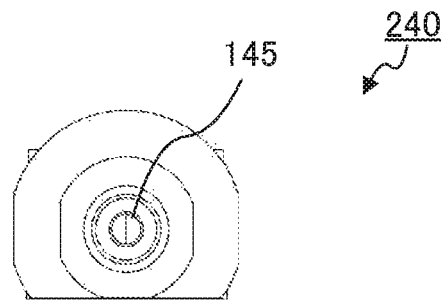
Figure 11:
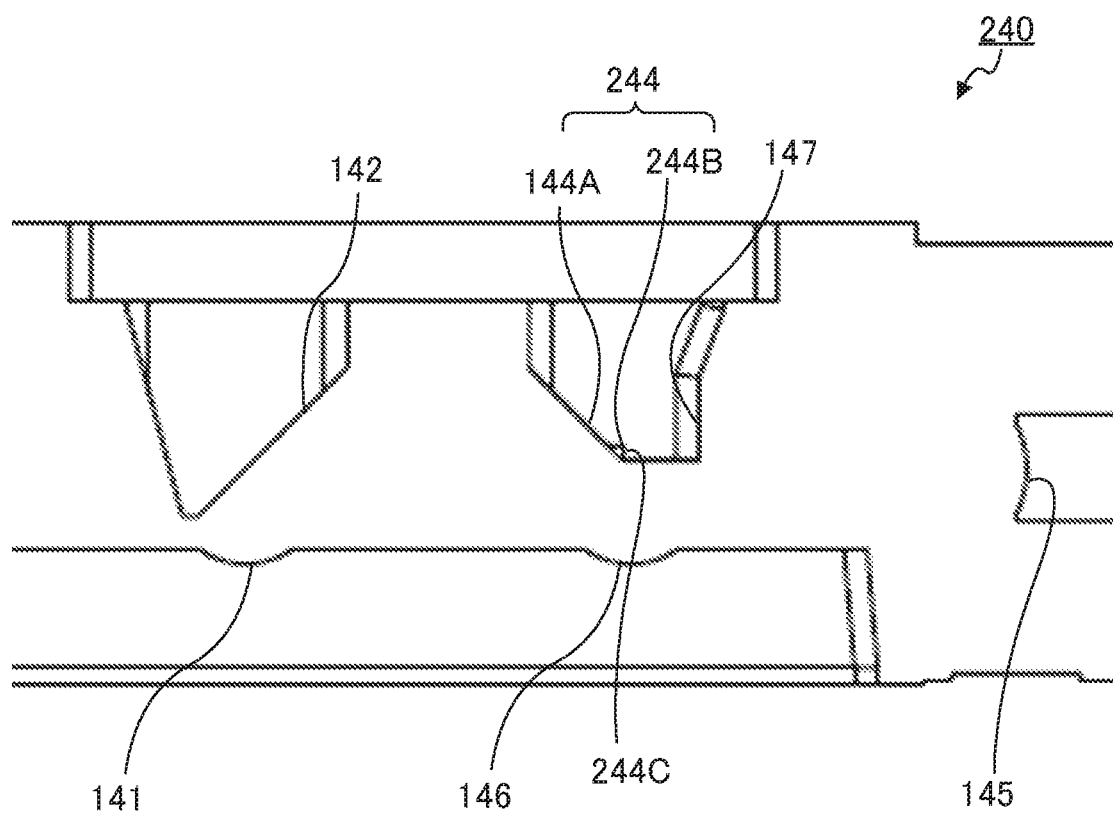
FIG. 11 is a partially enlarged sectional view illustrating a configuration of the optical receptacle according to Embodiment 2.

FIGS. 10A to 11 illustrate a configuration of optical receptacle 240 according to the present embodiment. FIG. 10A is a plan view of optical receptacle 240, FIG. 10B is a bottom view of optical receptacle 240, and FIG. 10C is a front view of optical receptacle 240. FIG. 11 is a partially enlarged sectional view illustrating a configuration of optical receptacle 240 according to the present embodiment.

As illustrated in FIGS. 10A to 11, optical receptacle 240 has a configuration same as that of optical receptacle 140 according to Embodiment 1 illustrated in FIG. 1 except that the shape of second transmission part 244B of light separation part 244 is different and that fourth optical surface 147 disposed on the light path between light separation part 244 (transmission surface 244C of light separation part 244) and second optical surface 145 is further provided.

Second transmission part 244B includes transmission surface 244C that is disposed on the light path between first optical surface 141 and second optical surface 145 and is perpendicular to the optical axis of signal light Ls separated by light separation part 244. Here, the perpendicular surface is a surface that is at ±5° or smaller, preferably 0°, to a line perpendicular to the optical axis of signal light Ls separated by light separation part 244. Transmission surface 244C emits, to the outside of optical receptacle 240, signal light Ls separated by light separation part 244.

Fourth optical surface 147 is a surface that is formed in the top side of optical receptacle 240, and is perpendicular to the optical axis of signal light Ls separated by light separation part 244. The perpendicular surface means a surface that is at ±5° or smaller, preferably 0°, to a line perpendicular to the optical axis of signal light Ls separated by light separation part 244. Fourth optical surface 147 is disposed on the light path between transmission surface 244C and second optical surface 145. Fourth optical surface 147 allows, to re-enter optical receptacle 240, signal light Ls separated by light separation part 244 and emitted to the outside of optical receptacle 240. With this configuration, it is possible to allow, to re-enter optical receptacle 140, signal light Ls travelling toward end surface 125 of optical transmission member 160 without refracting the light.

Operation

As illustrated in FIG. 9, in optical module 200 according to the present embodiment, the light entered from first optical surface 141 is reflected by reflection surface 142 such that a part of the light passes through first transmission part 143 and becomes signal light Ls travelling toward optical transmission member 160, and that the other part (preferably the remaining part) of the light impinges on light separation part 244. A part of the light impinging on light separation part 244 is reflected by reflection part 144A and becomes monitor light Lm travelling toward detection element 123, and another part of the light impinging on light separation part 244 (preferably light other than the light reflected by reflection part 144A) passes through second transmission part 244B so as to be emitted to the outside of optical receptacle 240 from transmission surface 244C as signal light Ls travelling toward optical transmission member 160. Signal light Ls emitted from transmission surface 244C re-enters optical receptacle 240 from fourth optical surface 147. Then, signal light Ls re-entered from fourth optical surface 147 and signal light Ls past first transmission part 143 are emitted from second optical surface 145 so as to reach end surface 125 of optical transmission member 160.

In this manner, in optical module 200 according to the present embodiment, even when the position of the light entered from first optical surface 141 is displaced upward with respect to first transmission part 143 due to a positional displacement of light separation part 244 in optical receptacle 240, for example, the highly intense light located near the center passes through second transmission part 244B toward second optical surface 145, and thus reduction of the intensity of signal light Ls is small as in Embodiment 1. That is, the variation in light splitting ratio between signal light Ls and monitor light Lm can be eased.

Effect

As described above, in optical module 200 according to the present embodiment, even when the position of light separation part 244 is displaced in optical receptacle 240, the variation in light splitting ratio between monitor light Lm and signal light Ls can be reduced as in Embodiment 1. Thus, the level of positional accuracy of light separation part 244 required in optical receptacle 240 can be eased.

Embodiment 3

Configuration of Optical Module

Optical module 300 according to Embodiment 3 is different from optical module 100 according to Embodiment 1 in that optical receptacle 340 is of a lens array type and that a configuration is designed for a multichannel light transmission. In the following description, the components similar to those of Embodiment 1 are denoted with the same reference numerals and the description thereof will be omitted.

Figure 12:
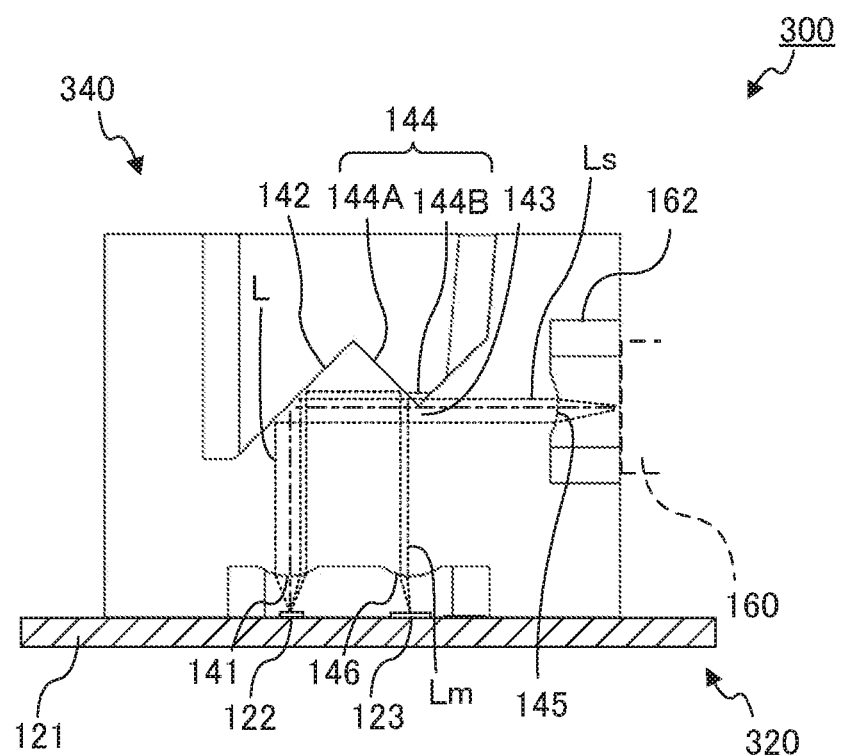
FIG. 12 is a sectional view of an optical module according to Embodiment 3.

FIG. 12 is a sectional view of optical module 300 according to Embodiment 3. As illustrated in FIG. 12, optical module 300 includes photoelectric conversion device 320 of a substrate mounting type including light-emitting element 122, and optical receptacle 340.

In optical module 300 according to the present embodiment, optical transmission member 160 is attached to optical receptacle 340 by means of a publicly known attaching member in the state where optical transmission member 160 is housed in a multicore collective connector. In the present embodiment, four optical transmission members 160 are arranged in one line at a constant interval. Note that optical transmission members 160 may be disposed in two or more lines.

Photoelectric conversion device 320 includes substrate 121, a plurality of light-emitting elements 122, and a plurality of detection elements 123. Any number of light-emitting elements 122 and detection elements 123 may be provided as long as a plurality of light-emitting elements 122 and detection elements 123 are provided. In the present embodiment, four light-emitting elements 122 and four detection elements 123 are provided.

Four light-emitting elements 123 are arranged in a line on substrate 121. In FIG. 12, four light-emitting elements 122 are arranged in a line in the depth direction of the drawing. Four light-emitting elements 122 are arranged along the arrangement direction of optical transmission member 160 at a constant interval.

Four detection elements 123 are disposed on substrate 121. Four detection elements 123 are arranged in one line at a constant interval in association with four light-emitting elements 122.

Configuration of Optical Receptacle

Figure 13A:
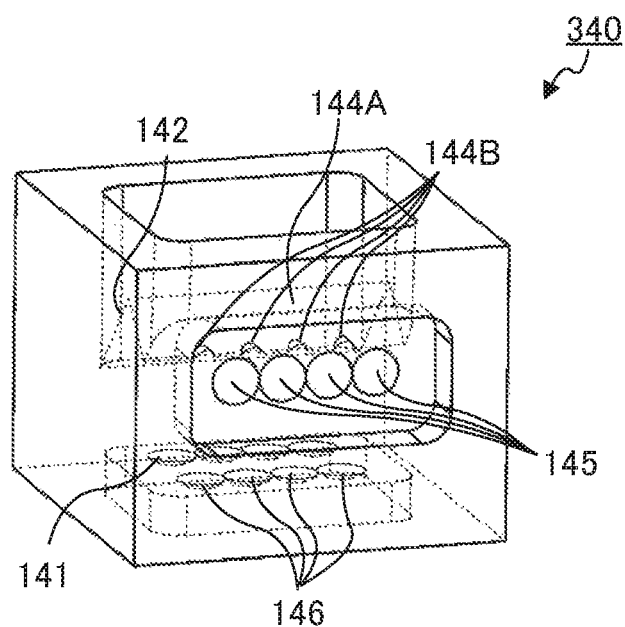
FIGS. 13A and 13B are perspective views illustrating a configuration of an optical receptacle according to Embodiment 3.
Figure 13B:
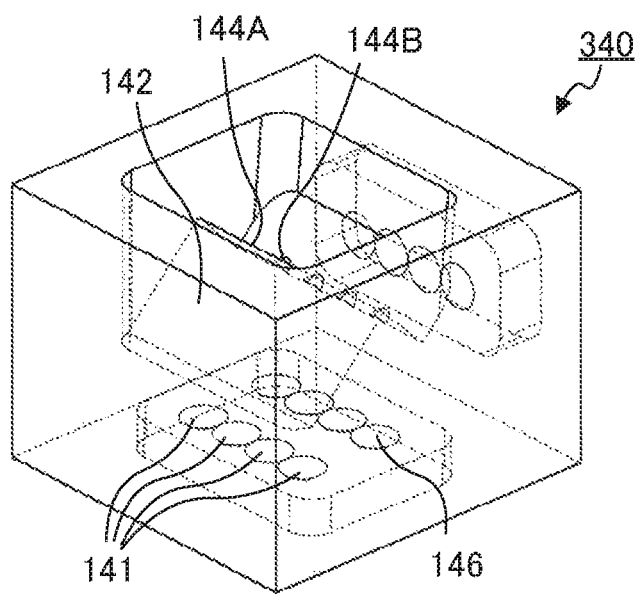
Figure 14A:
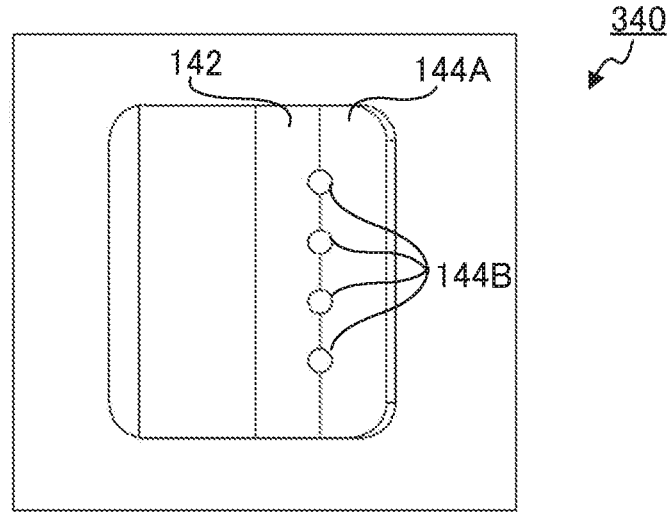
FIGS. 14A to 14C illustrate a configuration of the optical receptacle according to Embodiment 3.
Figure 14B:
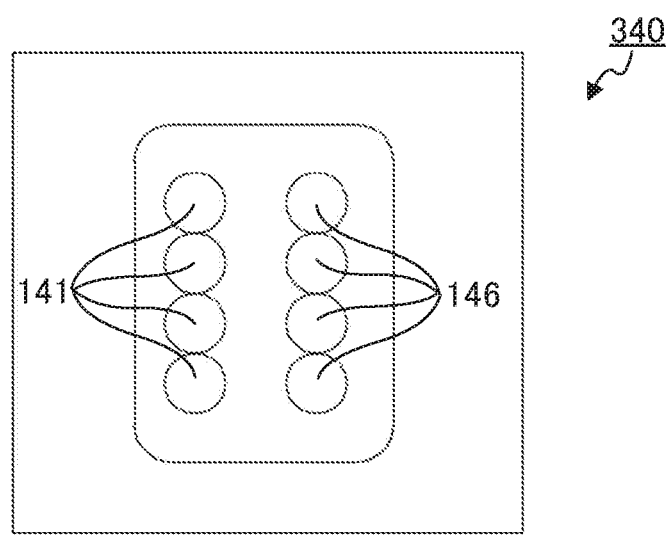
Figure 14C:
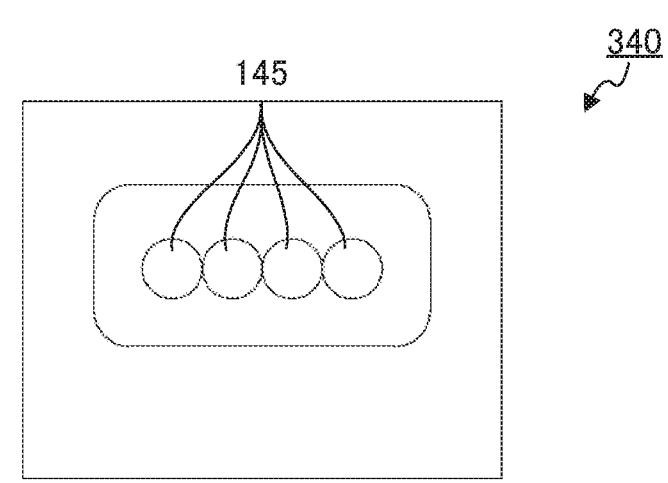

FIGS. 13A to 14C illustrate a configuration of optical receptacle 340 according to the present embodiment. FIG. 13A is a perspective view of optical receptacle 340 as viewed from the front side, and FIG. 13B is a perspective view of optical receptacle 340 as viewed from the back side. FIG. 14A is a plan view of optical receptacle 340, FIG. 14B is a bottom view of optical receptacle 340, and FIG. 14C is a front view of optical receptacle 340.

As illustrated in FIGS. 13A to 14C, optical receptacle 340 according to the present embodiment includes a plurality of first optical surfaces 141, reflection surface 142, a plurality of first transmission parts 143, a plurality of reflection parts 144A, a plurality of second transmission parts 144B, a plurality of second optical surfaces 145 and a plurality of third optical surfaces 146. In the present embodiment, four first optical surfaces 141, four second optical surfaces 145, four first transmission parts 143, four second transmission parts 144B and four third optical surfaces 146 are provided.

Effect

Optical module 300 according to the present embodiment can support a multichannel light transmission entailing monitoring while achieving the effect of Embodiment 1.

While each of optical receptacles 140, 240 and 340 has reflection surface 142 in Embodiments 1 to 3, this is not limitative.

Figure 15:
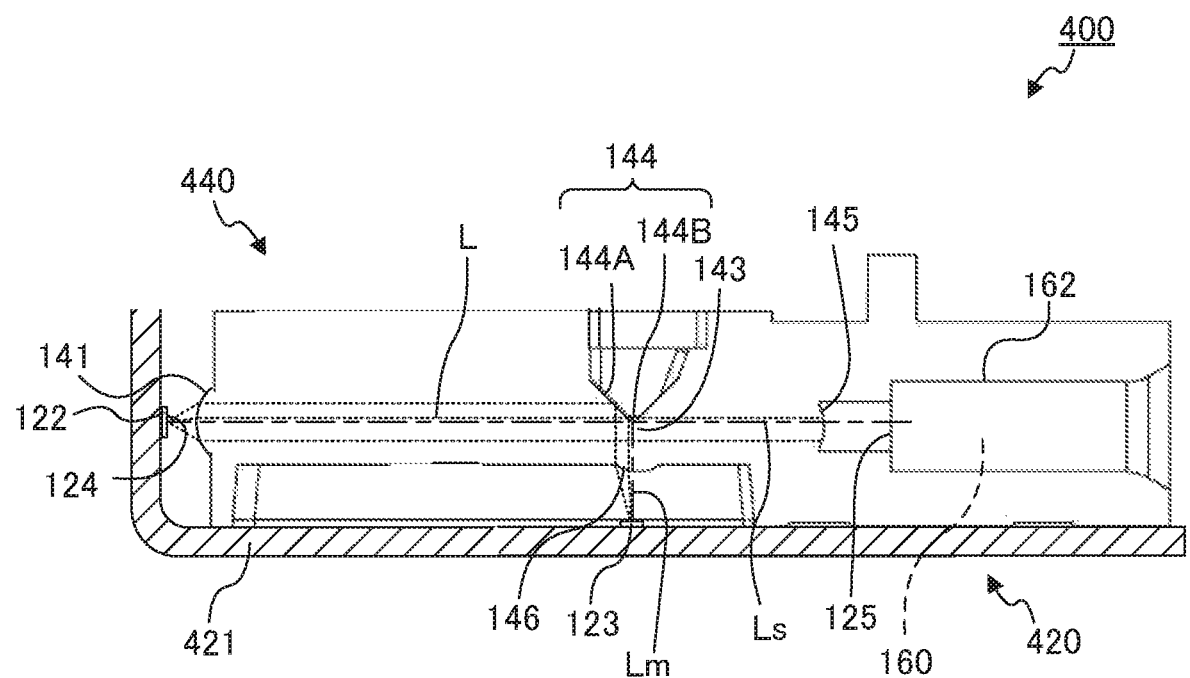
FIG. 15 is a sectional view of an optical module according to a modification.

FIG. 15 is a sectional view of optical module 400 according to a modification. As illustrated in FIG. 15, optical module 400 includes photoelectric conversion device 420 including light-emitting element 122, and optical receptacle 440. Optical receptacle 440 of FIG. 1 has a configuration same as that of optical receptacle 140 except that first optical surface 141 is disposed in the back surface of optical receptacle 440 and that reflection surface 142 is not provided. Substrate 421 of photoelectric conversion device 420 is disposed such that light-emitting element 122 faces first optical surface 141 of optical receptacle 440 and that detection element 123 faces third optical surface 146.

While reflection surface 142 and reflection part 144A are not in contact with each other in the top side of optical receptacles 140, 240 and 340 in Embodiments 1 to 3, this is not limitative, and reflection surface 142 and reflection part 144A may be in contact with each other.

In addition, while the shapes of first optical surface 141, second optical surface 145 and third optical surface 146 are each a convex lens surface in optical receptacles 140, 240 and 340 in Embodiments 1 to 3, this is not limitative, and the shape may be a flat surface, for example. In addition, while a configuration in which each of first optical surface 141, second optical surface 145 and third optical surface 146 has a circular shape in plan view is described above, this is not limitative.

In addition, while each of four first optical surfaces 141 is used as transmitting first optical surface 141 (optical module 300 is used as a transmitting optical module) in FIGS. 13A and 13B in Embodiment 3, this is not limitative. For example, each of four first optical surfaces 141 may be used as receiving first optical surface 141 (optical module 300 may be used as receiving optical module), or two first optical surfaces 141 on the right or left side may be used as receiving first optical surfaces 141 (optical module 300 may be used as a transmitting-and-receiving optical module).

In addition, while the surface that is opposite to reflection part 144A with second transmission part 144B therebetween is an inclined surface in Embodiments 1 and 3, this is not limitative, and the surface may be a surface perpendicular to the optical axis of signal light Ls separated by light separation part 144. The perpendicular surface is a surface that is at ±5° or smaller, preferably 0°, to the optical axis of a line perpendicular to signal light Ls separated by light separation part 144.

This application is entitled to and claims the benefit of Japanese Patent Application No. 2017-138328 filed on Jul. 14, 2017, the disclosure each of which including the specification, drawings and abstract is incorporated herein by reference in its entirety.

INDUSTRIAL APPLICABILITY

The optical receptacle and the optical module according to the embodiment of the present invention are suitable for optical communications using an optical transmission member.

REFERENCE SIGNS LIST

100, 200, 300, 400 Optical module
120, 320, 420 Photoelectric conversion device
121, 421 Substrate
122 Light-emitting element
123 Detection element
124 Light-emitting surface
125 End surface
140, 240, 340, 440 Optical receptacle
141 First optical surface
142 Reflection surface
143 First transmission part
144, 244 Light separation part
144A Reflection part
144B, 244B Second transmission part
145 Second optical surface
146 Third optical surface
147 Fourth optical surface
148 Boundary part
160 Optical transmission member
162 Ferrule
244C Transmission surface
L Emission light
Lm Monitor light
Ls Signal light
A Optical effective region
Rmax Radius

What is claimed is:

1. An optical receptacle configured to optically couple a light-emitting element and an end surface of an optical transmission member when the optical receptacle is disposed between a photoelectric conversion device and the optical transmission member, the photoelectric conversion device including the light-emitting element and a detection element configured to monitor light emitted from the light-emitting element, the optical receptacle comprising:

a first optical surface configured to allow incidence of the light emitted from the light-emitting element;

a first transmission part configured to allow, to pass through the first transmission part as signal light travelling toward the end surface of the optical transmission member, a part of light entered from the first optical surface;

a light separation part configured to separate another part of the light entered from the first optical surface into monitor light travelling toward the detection element and signal light travelling toward the end surface of the optical transmission member;

a second optical surface configured to emit, toward the end surface of the optical transmission member, the signal light past the first transmission part and the signal light separated by the light separation part; and a third optical surface configured to emit, toward the detection element, the monitor light separated by the light separation part, wherein the light separation part includes
a reflection part that is an inclined surface inclined to an optical axis of the light entered from the first optical surface, the reflection part being configured to reflect, toward the third optical surface as the monitor light, a part of light impinging on the light separation part, and a second transmission part disposed next to the reflection part, and configured to allow, to pass through the second transmission part as the signal light, another part of the light impinging on the light separation part, and wherein the first transmission part and the second transmission part are located within an optical effective region, the optical effective region being a region around an optical axis of light entered from the first optical surface and emitted from the second optical surface, the optical axis being a central axis of the optical effective region, the optical effective region being a region whose outer edge is a surface whose distance to the central axis is equal to a radius of one of the first optical surface and second optical surface, the radius being larger than a radius of the other of the first optical surface and second optical surface.

2. The optical receptacle according to claim 1, wherein the second transmission part is in contact with the first transmission part.

3. The optical receptacle according to claim 1, wherein the second transmission part has an arch shape in a cross-section perpendicular to the optical axis of the light entered from the first optical surface.

4. The optical receptacle according to claim 1, wherein the signal light past the second transmission part is emitted first from the second optical surface to outside of the optical receptacle.

5. The optical receptacle according to claim 1,
wherein the second transmission part further includes a transmission surface disposed on a light path between the first optical surface and the second optical surface, the transmission surface being perpendicular to an optical axis of the signal light separated by the light separation part; and the optical receptacle further comprises a fourth optical surface disposed on a light path between the transmission surface and the second optical surface, the fourth optical surface being configured to allow, to re-enter the optical receptacle, the signal light emitted from the transmission surface to outside of the optical receptacle.

6. The optical receptacle according to claim 1,
further comprising a reflection surface disposed on a light path between the first optical surface and the first transmission part, and on a light path between the first optical surface and the light separation part, the reflection surface being configured to reflect, toward the first transmission part and the light separation part, the light entered from the first optical surface.

7. An optical module comprising:
a photoelectric conversion device including a substrate, a light-emitting element disposed on the substrate, and a detection element disposed on the substrate and configured to monitor light emitted from the light-emitting element; and
the optical receptacle according to claim 1, wherein the first transmission part and the second transmission part are located within a light flux of light that is emitted from the light-emitting element and is entered from the first optical surface.

* * * * *